United States Patent
Hashimoto

(10) Patent No.: US 11,476,642 B2
(45) Date of Patent: Oct. 18, 2022

(54) QUANTUM CASCADE LASER

(71) Applicant: SUMITOMO ELECTRIC INDUSTRIES, LTD., Osaka (JP)

(72) Inventor: Jun-Ichi Hashimoto, Osaka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 91 days.

(21) Appl. No.: 17/173,993

(22) Filed: Feb. 11, 2021

(65) Prior Publication Data
US 2021/0305785 A1    Sep. 30, 2021

(30) Foreign Application Priority Data
Mar. 24, 2020 (JP) .............................. JP2020-053060

(51) Int. Cl.
 *H01S 5/34* (2006.01)
 *H01S 5/10* (2021.01)
 *H01S 5/026* (2006.01)

(52) U.S. Cl.
 CPC .......... *H01S 5/3401* (2013.01); *H01S 5/0268* (2013.01); *H01S 5/1003* (2013.01)

(58) Field of Classification Search
 CPC .............................. H01S 5/1003; H01S 5/0268
 See application file for complete search history.

(56) References Cited

U.S. PATENT DOCUMENTS

2017/0244222 A1* 8/2017 Hashimoto ........... H01S 5/1231
2018/0166860 A1* 6/2018 Hashimoto ............ H01S 5/227

FOREIGN PATENT DOCUMENTS

JP   2010-514163 A   4/2010
WO   2008/127454 A1  10/2008

* cited by examiner

*Primary Examiner* — Tuan N Nguyen
(74) *Attorney, Agent, or Firm* — Oliff PLC

(57) ABSTRACT

A quantum cascade laser includes a first and a second mesa waveguides disposed on a substrate, a first electrode, a second electrode, and a current blocking region disposed burying the first and second mesa waveguides. The first and second mesa waveguides extend in a first direction. The first and second mesa waveguides are arranged apart from each other by a distance in a second direction intersecting with the first direction. The current blocking region has a first portion disposed between the first and second mesa waveguides and a second portion disposed on the first portion. The end of the first electrode and the end of the second electrode are facing each other in the second direction. The second portion protrudes from a reference plane which includes a surface of the end of the first electrode and extends in the first and second directions.

9 Claims, 11 Drawing Sheets

QUANTUM CASCADE LASER

CROSS REFERENCE TO RELATED APPLICATIONS

The present application is based upon and claims the benefit of the priority from Japanese patent application No. 2020-053060, filed on Mar. 24, 2020, which is hereby incorporated by reference in its entirety.

TECHNICAL FIELD

The present disclosure relates to quantum cascade lasers.

BACKGROUND

Japanese Translation of PCT International Application Publication No. 2010-514163 discloses a quantum cascade laser having a plurality of mesa waveguides spaced apart from each other.

SUMMARY

The present disclosure provides a quantum cascade laser including a first mesa waveguide disposed on a substrate, the first mesa waveguide including a first core layer, a second mesa waveguide disposed on the substrate, the second mesa waveguide including a second core layer, a first electrode electrically connected to the first mesa waveguide, a second electrode electrically connected to the second mesa waveguide, and a current blocking region disposed on the substrate, the current blocking region burying the first and second mesa waveguides. The first and second mesa waveguides extend in a first direction. The first and second mesa waveguides are arranged apart from each other by a distance in a second direction intersecting with the first direction. The current blocking region has a first portion and a second portion. The first portion is disposed between the first mesa waveguide and the second mesa waveguide. The second portion is disposed on the first portion. Each of the first electrode and the second electrode has an end. The end of the first electrode and the end of the second electrode are facing each other in the second direction. The second portion protrudes from a reference plane. The reference plane includes a surface of the end of the first electrode and extends in the first and second directions.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION

Figure 1:
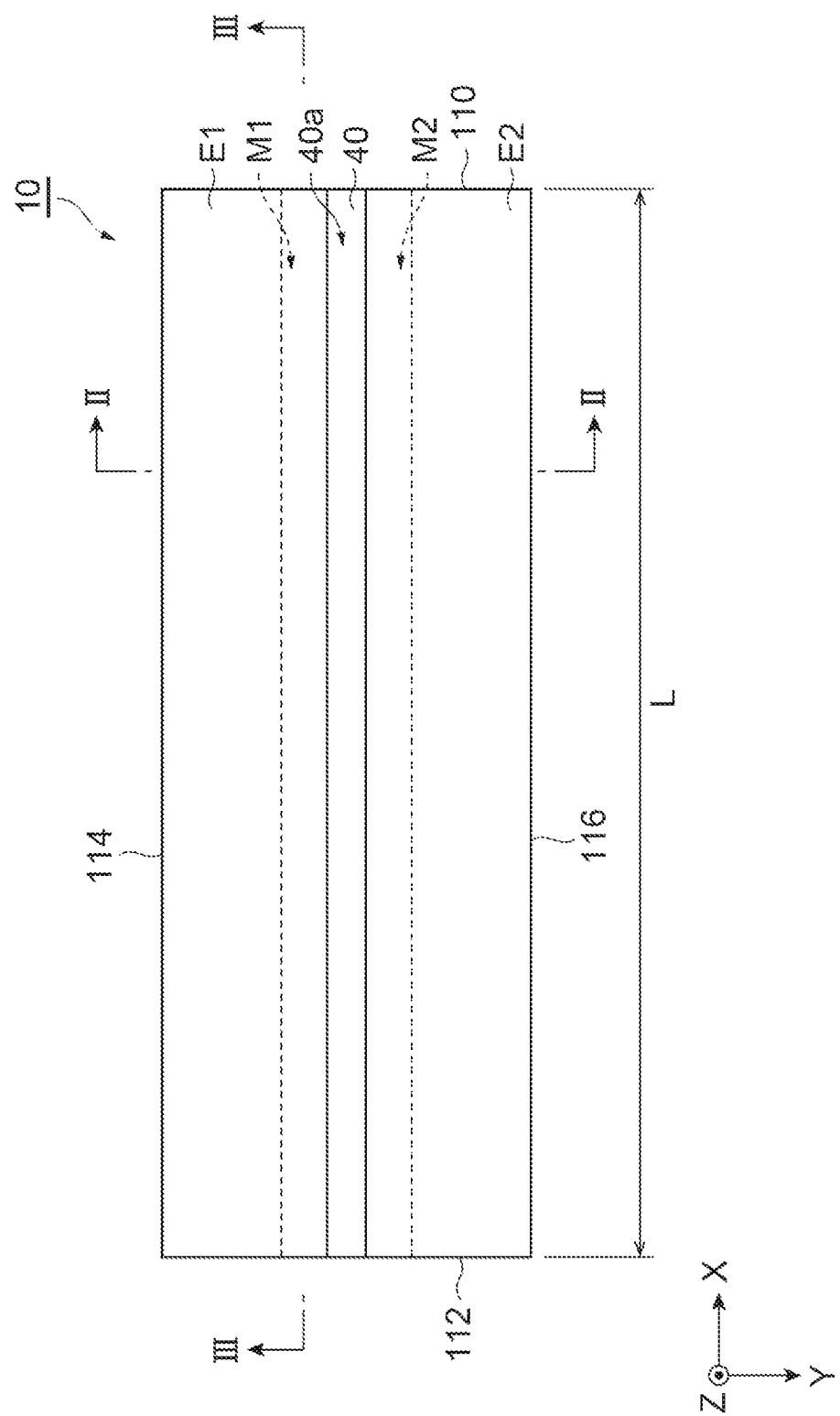
FIG. 1 is a schematic plan view of a quantum cascade laser according to one embodiment.

Problem to be Solved by the Present Disclosure

A quantum cascade laser array includes a plurality of mesa waveguides spaced apart from each other and electrodes each connected to the top face of the respective mesa waveguides. Since a distance between adjacent electrodes is usually the same as a distance between adjacent mesa waveguides, the distance between electrodes decreases as the distance between mesa waveguides decreases. This may cause discharge between adjacent electrodes.

The present disclosure provides a quantum cascade laser capable of reducing the possibility of discharge between adjacent electrodes.

Description of Embodiments of the Present Disclosure

A quantum cascade laser according to one embodiment includes a first mesa waveguide disposed on a substrate, the first mesa waveguide including a first core layer, a second mesa waveguide disposed on the substrate, the second mesa waveguide including a second core layer, a first electrode electrically connected to the first mesa waveguide, a second electrode electrically connected to the second mesa waveguide, and a current blocking region disposed on the substrate, the current blocking region burying the first and second mesa waveguides. The first and second mesa waveguides extend in a first direction. The first and second mesa waveguides are arranged apart from each other by a distance in a second direction intersecting with the first direction. The current blocking region has a first portion and a second portion. The first portion is disposed between the first mesa waveguide and the second mesa waveguide. The second portion is disposed on the first portion. Each of the first electrode and the second electrode has an end. The end of the first electrode and the end of the second electrode are facing each other in the second direction. The second portion protrudes from a reference plane. The reference plane includes a surface of the end of the first electrode and extends in the first and second directions.

The above-mentioned quantum cascade laser can reduce the possibility of discharge between the first electrode and the second electrode by having the second portion in the current blocking region even if a distance between the first mesa waveguide and the second mesa waveguide is reduced.

The above-mentioned quantum cascade laser may further include an insulating layer covering the second portion. The insulating layer further reduces the possibility of discharge between the first electrode and the second electrode.

The current blocking region may have a third portion, a fourth portion disposed on the third portion, a fifth portion, and a sixth portion disposed on the fifth portion. The first mesa waveguide may be disposed between the first portion and the third portion. The second mesa waveguide may be disposed between the first portion and the fifth portion. The fourth portion and the sixth portion may protrude from the reference plane. In this case, the second portion is located between the fourth portion and the sixth portion in the second direction. An external force is thus less likely to be applied to the second portion, which reduces the risk of damage to the second portion.

The first mesa waveguide may have a first side surface and a second side surface. The second mesa waveguide may have a third side surface and a fourth side surface. The first to fourth side surfaces extend in the first direction. The second side surface faces the third side surface. The second portion may extend in the second direction from the second side surface toward the first side surface and from the third side surface toward the fourth side surface. In this case, the length of the second portion becomes larger in the second direction. This further reduces the possibility of discharge between the first electrode and the second electrode.

The above-mentioned quantum cascade laser may further include a first contact layer electrically connected to the first electrode and a top of the first mesa waveguide, and a second contact layer electrically connected to the second electrode and a top of the second mesa waveguide. The first mesa waveguide may have a first side surface and a second side surface. The second mesa waveguide may have a third side surface and a fourth side surface. The first to fourth side surfaces may extend in the first direction. The second side surface may face the third side surface. The first contact layer may extend to a position opposite to the second side surface with respect to the first side surface in the second direction. The second contact layer may extend to a position opposite to the third side surface with respect to the fourth side surface in the second direction. In this case, lengths of the first contact layer and the second contact layer can be increased in the second direction.

The above-mentioned quantum cascade laser may further include a first cladding layer disposed between the first contact layer and the top of the first mesa waveguide, and a second cladding layer disposed between the second contact layer and the top of the second mesa waveguide. The first cladding layer may extend to a position opposite to the second side surface with respect to the first side surface in the second direction. The second cladding layer may extend to a position opposite to the third side surface with respect to the fourth side surface in the second direction. In this case, current is injected from the first electrode into the first core layer through the first contact layer and first cladding layer. If the first contact layer and the first cladding layer extend to a position outside the first side surface, electric resistance of the current path that runs from the first electrode to the first mesa waveguide decreases. Similarly, current is injected from the second electrode to the second core layer through the second contact layer and the second cladding layer. If the second contact layer and the second cladding layer extend to a position outside the fourth side surface, electric resistance of the current path that runs from the second electrode to the second mesa waveguide decreases.

Description of the Embodiments

Hereinafter, embodiments of the present disclosure will be described in detail with reference to the accompanying drawings. In the description of the drawings, the same reference numerals are used for the same or equivalent elements, and a repetitive description is omitted. In the drawings, an X-axis direction (first direction), a Y-axis direction (second direction), and a Z-axis direction which intersect with each other are shown as necessary. The X-axis direction, the Y-axis direction and the Z-axis direction are, for example, perpendicular to each other.

Figure 2:
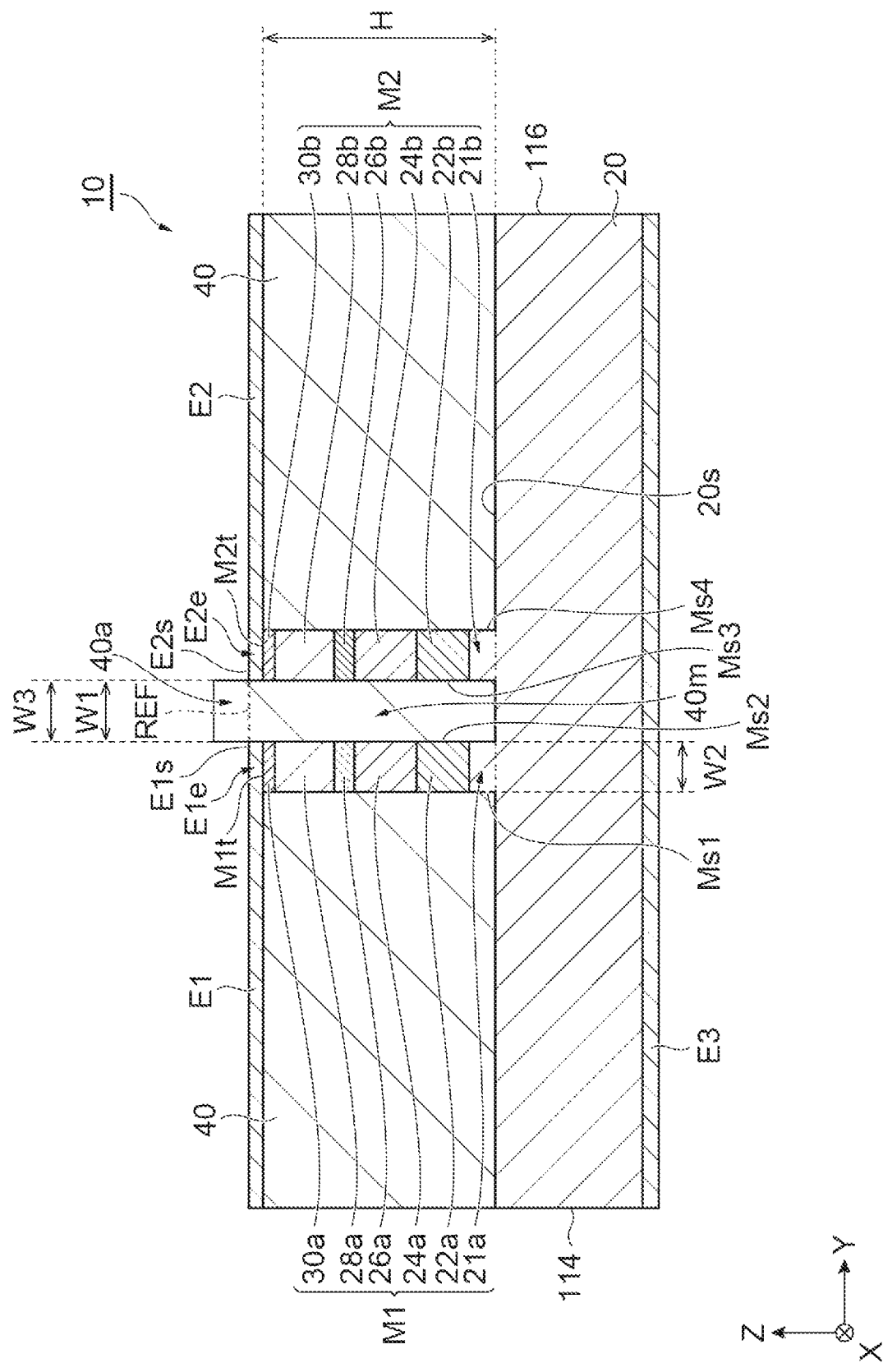
FIG. 2 is a sectional view taken along line II-II in FIG. 1.
Figure 3:
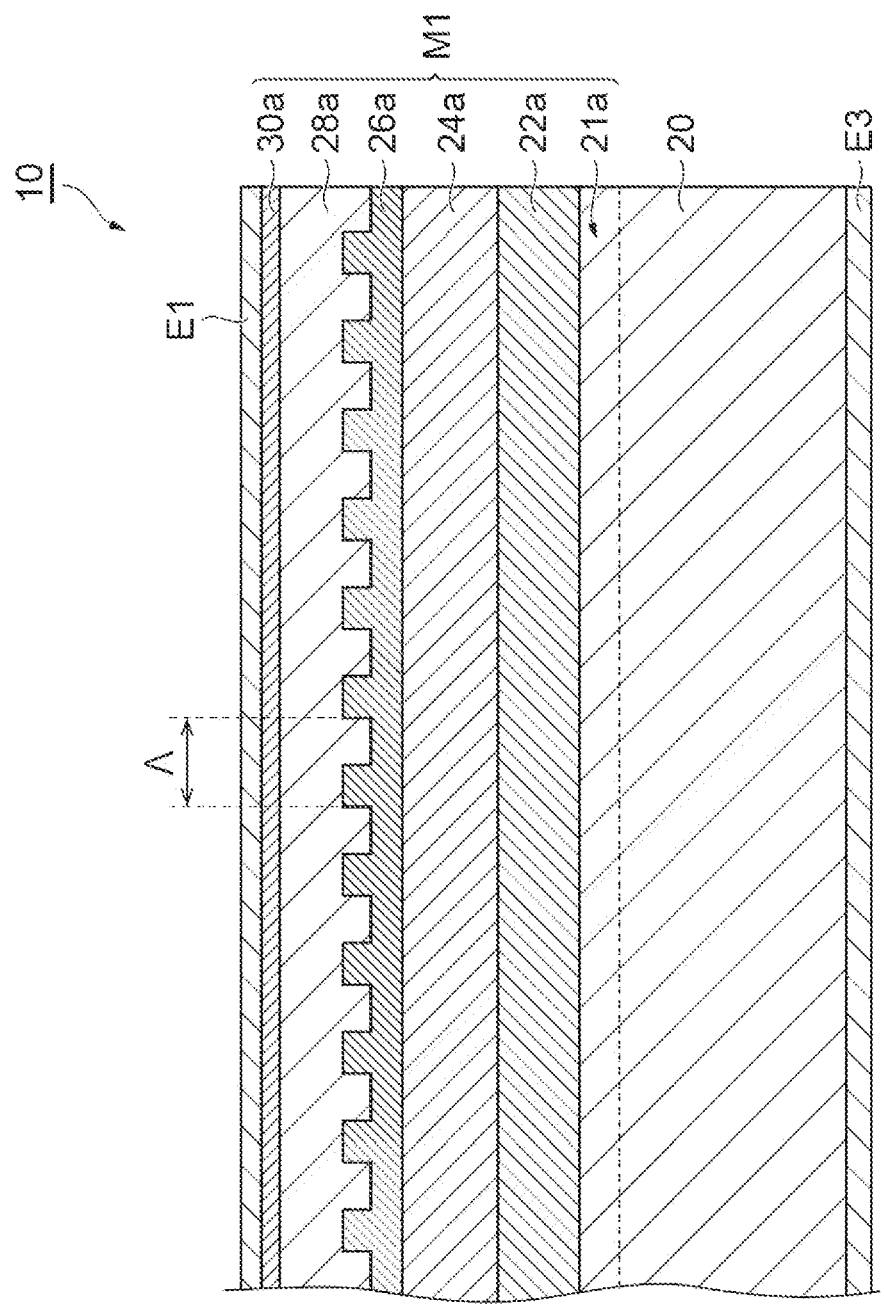
FIG. 3 is a sectional view taken along line III-III in FIG. 1.

FIG. 1 is a plan view schematically showing a quantum cascade laser according to an embodiment. FIG. 2 is a sectional view taken along line II-II in FIG. 1. FIG. 3 is a sectional view taken along line III-III in FIG. 1.

A quantum cascade laser 10 shown in FIG. 1, FIG. 2, and FIG. 3 is used in, for example, an industrial laser processing apparatus or an optical measurement system for environmental analysis, industrial gas analysis, or medical diagnosis. Quantum cascade laser 10 is a resonator capable of oscillating a laser light in the X-axis direction. The laser light may include, for example, infrared light such as mid-infrared light. Quantum cascade laser 10 has an output facet 110 for emitting a laser light in the X-axis direction and a reflection facet 112 opposite to output facet 110 in the X-axis direction. Output facet 110 is a front end surface. Reflection facet 112 is a rear end surface. Each of output facet 110 and reflection facet 112 may be perpendicular to the X-axis direction. Each of output facet 110 and reflection facet 112 has, for example, a rectangular shape. A low reflection film and a high reflection film may be formed on output facet 110 and reflection facet 112, respectively. Quantum cascade laser 10 has side surfaces 114 and 116 (fifth and sixth side surfaces, respectively) extending in the X-axis and the Z-axis directions. Each of side surfaces 114 and 116 has, for example, a rectangular shape. Quantum cascade laser 10 has, for example, a rectangular parallelepiped shape. Quantum cascade laser 10 has a length L of, for example, 1 mm to 3 mm in the X-axis direction.

Quantum cascade laser 10 includes a substrate 20, a first mesa waveguide M1 provided on substrate 20, and a second mesa waveguide M2 provided on substrate 20. First mesa waveguide M1 and second mesa waveguide M2 are monolithically integrated on substrate 20. First mesa waveguide M1 and second mesa waveguide M2 extend in the X-axis direction and are separated from each other in the Y-axis direction. First mesa waveguide M1 and second mesa waveguide M2 are provided on a principal surface 20s of substrate 20. More than two mesa waveguides may be provided on substrate 20.

First mesa waveguide M1 and second mesa waveguide M2 each have a width W2 (length in the Y-axis direction). Width W2 may be 3 μm or more, or 10 μm or less. A distance W1 between first mesa waveguide M1 and second mesa waveguide M2 may be greater than width W2. Distance W1 is the shortest distance between first mesa waveguide M1 and second mesa waveguide M2 in the Y-axis direction. Distance W1 may be measured in a plane including a top face M1t of first mesa waveguide M1 and a top face M2t of second mesa waveguide M2. Distance W1 may be 2 μm or more, 50 μm or more, 100 μm or less, 30 μm or less, or 10 μm or less.

First mesa waveguide M1 has a first side surface Ms1 and a second side surface Ms2. Second side surface Ms2 is opposite to first side surface Ms1. Second mesa waveguide M2 has a third side surface Ms3 and a fourth side surface Ms4. Fourth side surface Ms4 is opposite to third side surface Ms3. First side surface Ms1, second side surface Ms2, third side surface Ms3, and fourth side surface Ms4 extend in the X-axis direction and the Z-axis direction.

Second side surface Ms2 faces third side surface Ms3. A distance between second side surface Ms2 and third side surface Ms3 corresponds to distance W1 described above. A distance between first side surface Ms1 and second side surface Ms2 and a distance between third side surface Ms3 and fourth side surface Ms4 correspond to width W2 described above.

Quantum cascade laser 10 has a current blocking region 40 which buries first mesa waveguide M1 and second mesa waveguide M2. Current blocking region 40 is provided on substrate 20. Current blocking region 40 covers first side surface Ms1, second side surface Ms2, third side surface Ms3, and fourth side surface Ms4. In this case, quantum cascade laser 10 has a buried heterostructure.

Current blocking region 40 has a first portion 40m disposed between first mesa waveguide M1 and second mesa waveguide M2 and a second portion 40a disposed on first portion 40m. First portion 40m and second portion 40a extend in the X-axis direction. First portion 40m has a height H from principal surface 20s of substrate 20. The h eight H is the same as height H of first mesa waveguide M1 and second mesa waveguide M2.

Quantum cascade laser 10 includes a first electrode E1 electrically connected to first mesa waveguide M1 and a second electrode E2 electrically connected to second mesa waveguide M2. A third electrode E3 is provided on the back surface of substrate 20, the back surface being opposite to principal surface 20s.

First electrode E1 is connected to a top face M1t of first mesa waveguide M1. First electrode E1 is provided on top face M1t of first mesa waveguide M1 and current blocking region 40. First electrode E1 extends in the Y-axis direction from second side surface Ms2 to a side surface 114 of quantum cascade laser 10. First electrode E1 has an end E1e close to second electrode E2 in the Y-axis direction. End E1e is located on top face M1t of first mesa waveguide M1 and abuts against second portion 40a of current blocking region 40.

Second electrode E2 is connected to a top face M2t of second mesa waveguide M2. Second electrode E2 is provided on second mesa waveguide M2 and current blocking region 40. Second electrode E2 extends in the Y-axis direction from third side surface Ms3 to side surface 116 of quantum cascade laser 10. Second electrode E2 has an end E2e close to first electrode E1 in the Y-axis direction. End E2e faces End E1e in the Y-axis direction. End E2e is located on top face M2t of second mesa waveguide M2 and abuts against second portion 40a of current blocking region 40.

Second portion 40a projects upward beyond a reference plane REF which includes surface E1s of an end E1e of first electrode E1 and extends in the X-axis direction and the Y-axis direction. Reference plane REF may include surface E2s of end E2e of second electrode E2. The height from principal surface 20s of substrate 20 to surface E1s may be less than or equal to the height from principal surface 20s of substrate 20 to a surface E2s. Reference plane REF is a plane surface.

In this embodiment, second portion 40a is located between first electrode E1 and second electrode E2. A width W3 of second portion 40a in the Y-axis direction is the same as the distance between first electrode E1 and second electrode E2. Width W3 may be 2 μm or more or may be 100 μm or less.

Substrate 20 is, for example, an n-type group III-V compound semiconductor substrate such as an n-type InP substrate.

First mesa waveguide M1 extends in the X-axis direction and protrudes from principal surface 20s of the substrate in the Z-axis direction. The X-axis direction is the longitudinal direction of first mesa waveguide M1. First mesa waveguide M1 has a height H measured from principal surface 20s of substrate 20. Height H may be 10 μm or more. First mesa waveguide M1 is a laminated body including a plurality of semiconductor layers laminated in the Z-axis direction. First mesa waveguide M1 includes a lower cladding layer 22a provided on a protruding portion 21a provided on principal surface 20s of substrate 20, a core layer 24a (first core layer) provided on lower cladding layer 22a, a grating layer 26a provided on core layer 24a, an upper cladding layer 28a provided on grating layer 26a, and a contact layer 30a provided on upper cladding layer 28a. In the Z-axis direction, protruding portion 21a, lower cladding layer 22a, core layer 24a, grating layer 26a, upper cladding layer 28a and contact layer 30a are arranged in order. First electrode E1 is arranged on contact layer 30a. Core layer 24a also function as a light-emitting layer. An oscillation wavelength of laser light oscillated by a quantum cascade laser capable of oscillating mid-infrared light is, for example, 3 μm to 20 μm, which is longer than that oscillated by a laser for communication. Thus the light is spread over a range wider than a cross section of a core layer when propagating through the waveguide of quantum cascade laser. In order to cover a light distribution range, height H in one or more embodiments may be 10 μm or more, and the thicknesses of upper cladding layer 28a and lower cladding layer 22a in one or more embodiments may be, for example, 3 μm or more.

Second mesa waveguide M2 extends in the X-axis direction and protrudes in the Z-axis direction. The X-axis direction is the longitudinal direction of second mesa waveguide M2. Second mesa waveguide M2 has height H measured from principal surface 20s of substrate 20. Second mesa waveguide M2 is a laminated body including a plurality of semiconductor layers laminated in the Z-axis direction. Second mesa waveguide M2 includes a lower cladding layer 22b provided on a protruding portion 21b provided on principal surface 20s of substrate 20, a core layer 24b (second core layer) provided on lower cladding layer 22b, a grating layer 26b provided on core layer 24b, an upper cladding layer 28b provided on grating layer 26b, and a contact layer 30b provided on upper cladding layer 28b. In the Z-axis direction, protruding portion 21b, lower cladding layer 22b, core layer 24b, grating layer 26b, upper cladding layer 28b and contact layer 30b are arranged in order. A second electrode E2 is arranged on contact layer 30b. Core layer 24b also function as a light-emitting layer.

Protruding portions 21a and 21b include the same material as substrate 20.

Lower cladding layers 22a and 22b and upper cladding layers 28a and 28b are n-type group III-V compound semiconductor layers such as n-type InP layers. InP is transparent to mid-infrared light. The thickness of each of lower cladding layers 22a and 22b and upper cladding layers 28a and 28b may be 2 μm or more. Lower cladding layers 22a and 22b may be omitted, and protruding portions 21a and 21b and substrate 20 may function as lower cladding layers.

Core layers 24a and 24b have a structure in which a plurality of active layers and a plurality of injection layers are alternately laminated. Each of the active layers and the injection layers has a superlattice structure in which a plurality of well layers and a plurality of barrier layers are alternately laminated. Each of the well layers and the barrier layers has a thickness of several nm. A GaInAs/AlInAs superlattice or a GaInAsP/AlInAs superlattice may be used, for example. Only electrons can act as carriers. A laser light in the mid-infrared region with a wavelength of, for example, 3 μm to 20 μm is oscillated by subband transition in the conduction band.

Grating layer 26a has a plurality of recesses periodically arranged with a pitch Λ along the X-axis direction. Each recess is a groove extending in the Y-axis direction. Grating layer 26b has the same configuration as that of grating layer 26a except for pitch Λ. Pitch Λ defines the oscillation wavelength λ of the laser light. The wavelength of the laser light emitted from first mesa waveguide M1 and that of the laser light from second mesa waveguide M2 are thus different from each other. Grating layers 26a and 26b allow quantum cascade laser 10 to function as a distributed feedback (DFB) laser. Quantum cascade laser 10 allows single-mode oscillations. The recesses of grating layers 26a and 26b are filled with upper cladding layers 28a and 28b. Grating layers 26a and 26b are group III-V compound semiconductor layers such as unintentionally doped or n-type GaInAs layers.

Contact layers 30a and 30b are n-type group III-V compound semiconductor layers such as n-type GaInAs layers. Contact layer 30a is in ohmic contact with first electrode E1. Contact layer 30b is in ohmic contact with second electrode E2. The thicknesses of contact layers 30a and 30b may be 500 nm or less. Contact layers 30a and 30b may be omitted, and upper cladding layers 28a and 28b may function as contact layers.

One or more optical confinement layers may be provided between lower cladding layers 22a and 22b and core layers 24a and 24b. One or more optical confinement layers may be provided between grating layers 26a and 26b and core layers 24a and 24b. The optical confinement layers are group III-V compound semiconductor layers such as unintentionally doped or n-type GaInAs layers.

For example, Si, S, Sn, Se can be used an n-type dopant.

Current blocking region 40 may be unintentionally doped or semi-insulating group III-V compound semiconductor region. Current blocking region 40 has a high resistance of, for example, $10^5$ Ωcm or more to electrons. The semi-insulating group III-V compound semiconductor region is a region (an InP region, a GaInAs region, an AlInAs region, a GaInAsP region or an AlGaInAs region) doped with a transition metal such as Fe, Ti, Cr or Co.

Each of first electrode E1, second electrode E2, and third electrode E3 is, for example, a Ti/Au film, a Ti/Pt/Au film, or a Ge/Au film.

Quantum cascade laser 10 may be operated as follows. As voltage is applied between first electrode E1 and third electrode E3 to cause current to flow into core layer 24a, a laser light having a first wavelength is oscillated from first mesa waveguide M1. Similarly, as voltage is applied between second electrode E2 and third electrode E3 to cause current to flow into core layer 24b, a laser light having a second wavelength is oscillated from second mesa waveguide M2. The laser light having a second wavelength may be oscillated at timings different from those of the laser light having a first wavelength. The voltage applied to the electrodes may be 10 V or more, which is higher than the voltage applied to, for example, a semiconductor laser with a communication wavelength band of 1.3 μm or 1.55 μm. Higher drive voltages tend to cause discharges between electrodes during arraying. In quantum cascade laser 10 according to the present embodiment, the distance between electrodes (width W3) can be increased. Thus the possibility of discharge can be reduced.

By having second portion 40a of a current blocking region 40, quantum cascade laser 10 according to the present embodiment can reduce the possibility of discharge between first electrode E1 and second electrode E2 even if distance W1 between first mesa waveguide M1 and second mesa waveguide M2 is reduced. The possibility of discharge between first electrode E1 and second electrode E2 can thus be reduced even if there is any defective portion which serves as a starting point of discharge, such as a protrusion, a chipping, a crack, or an attachment of foreign matter in, for example, first electrode E1 or second electrode E2. Quantum cascade laser 10 can thus be operated as follows. For example, when a voltage is applied between first electrode E1 and third electrode E3 but not to second electrode E2, the laser light is emitted from first mesa waveguide M1, but not from second mesa waveguide M2. Similarly, when a voltage is applied between second electrode E2 and third electrode E3 but not to first electrode E1, the laser light is emitted from second mesa waveguide M2, but not from first mesa waveguide M1.

If distance W1 can be reduced, quantum cascade laser 10 can be reduced in size. In addition, a large number of mesa waveguides (e.g., three or more mesa waveguides) capable of emitting laser light of mutually differing wavelengths can be arranged on substrate 20. Furthermore, when distance W1 is small, a lens can be shared to collect or collimate the laser lights emitted from a large number of mesa waveguides.

Figure 4:
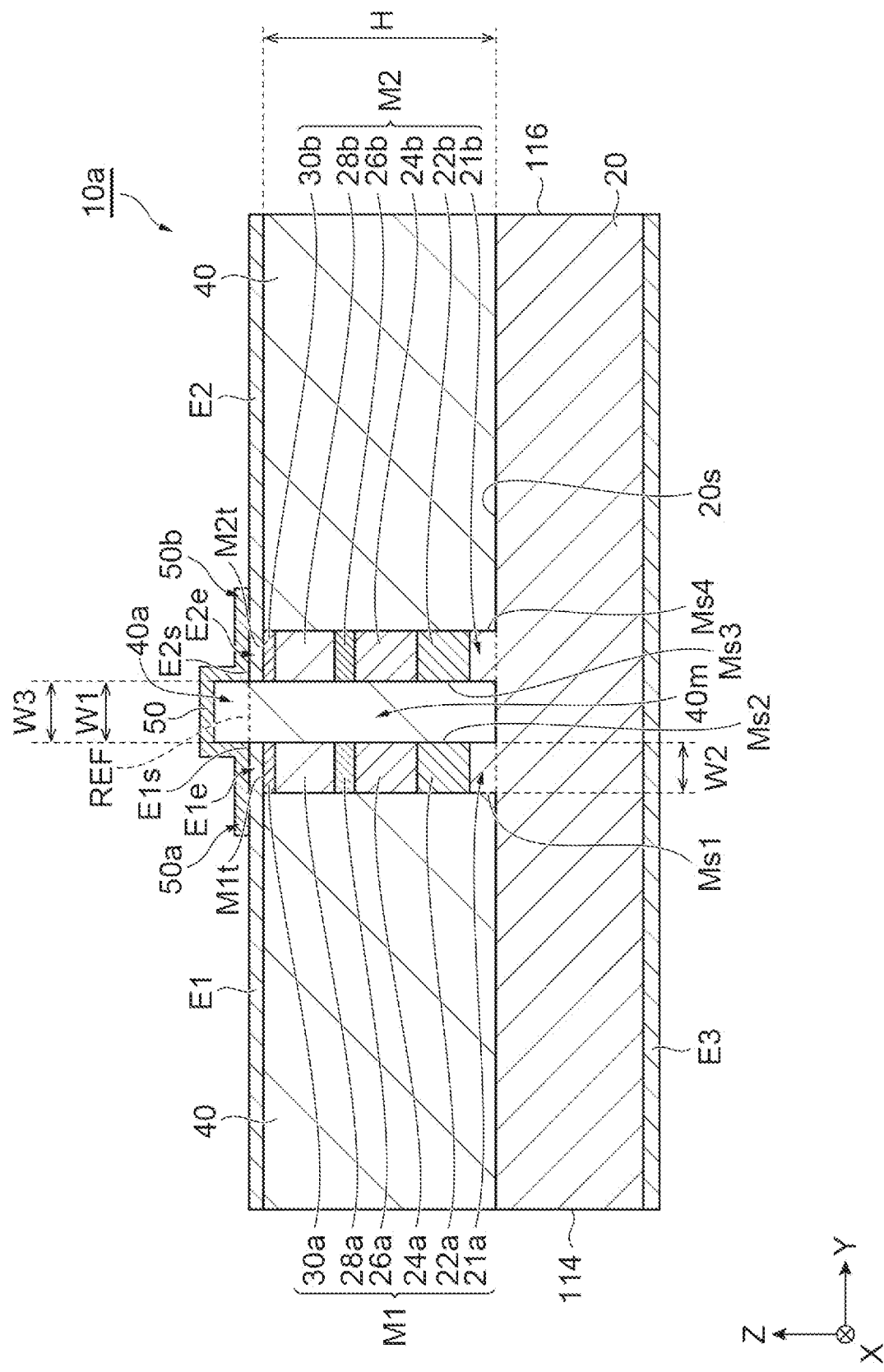
FIG. 4 is a schematic sectional view of a quantum cascade laser according to another embodiment.

FIG. 4 is a sectional view schematically showing a quantum cascade laser according to another embodiment. A quantum cascade laser 10a shown in FIG. 4 has the same configuration as that of quantum cascade laser 10 shown in FIG. 2 except that quantum cascade laser 10a further includes an insulating layer 50. Insulating layer 50 covers second portion 40a of current blocking region 40. In the Y-axis direction, one end 50a of insulating layer 50 is located on first electrode E1. In the Y-axis direction, the other end 50b of insulating layer 50 is located on second electrode E2. End portion 50a extends in the Y-axis direction to a position opposite to second side surface Ms2 in the Y-axis direction with respect to first side surface Ms1. End portion 50b extends in the Y-axis direction to a position opposite to third side surface Ms3 with respect to fourth side surface Ms4. Examples of insulating layer 50 materials include $SiO_2$ SiON, SiN, alumina, benzocyclobutene, and polyimide.

Quantum cascade laser 10a according to the present embodiment can yield the same effects as those of quantum cascade laser 10. In addition, insulating layer 50 improves the dielectric strength between first electrode E1 and second electrode E2. The possibility of discharge between first electrode E1 and second electrode E2 can thus be reduced further. Insulating layer 50 can reduce the oxidation of second portion 40a of current blocking region 40. Insulating layer 50 improves the mechanical strength of second portion 40a of current blocking region 40.

Figure 5:
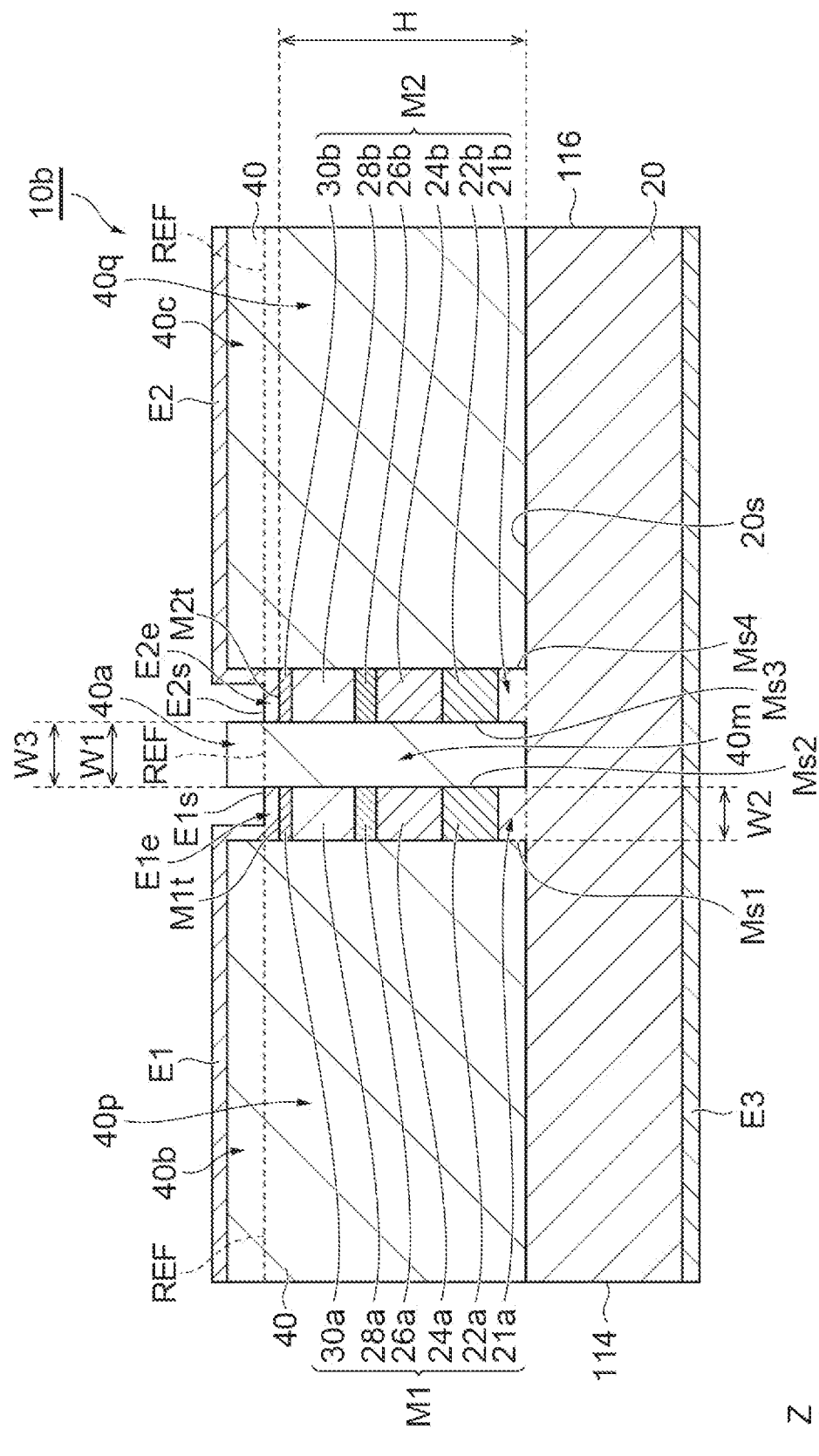
FIG. 5 is a schematic sectional view of a quantum cascade laser according to still another embodiment.

FIG. 5 is a sectional view schematically showing a quantum cascade laser according to still another embodiment. A quantum cascade laser 10b in FIG. 5 has the same configuration as that of quantum cascade laser 10 shown in FIG. 2 except that quantum cascade laser 10b includes current blocking region 40 of different shape. Current blocking region 40 in this embodiment includes a third portion 40p, a fourth portion 40b provided on third portion 40p, fifth portion 40q, and a sixth portion 40c provided on fifth portion 40q in addition to first portion 40m and second portion 40a. First mesa waveguide M1 is disposed between first portion 40m and third portion 40p. Second mesa waveguide M2 is disposed between first portion 40m and fifth portion 40q. Fourth portion 40b and sixth portion 40c projects upward beyond a reference plane REF. Upper surfaces of fourth portion 40b and sixth portion 40c may be at a height equal to that of an upper surface of second portion 40a. First electrode E1 is provided so as to cover fourth portion 40b. Second electrode E2 is provided so as to cover sixth portion 40c.

Quantum cascade laser 10b in this embodiment can yield the same effects as those of quantum cascade laser 10. In addition, as second portion 40a is located between fourth portion 40b and sixth portion 40c in the Y-axis direction, an external force is less likely to be applied to the second portion 40a. This reduces the risk of damage to the second portion 40a. For example, quantum cascade laser 10b may be epi-down mounted to the heat sink such that second portion 40a of quantum cascade laser 10b faces the underlying heat sink, preventing the load applied to quantum cascade laser 10b at the time of mounting from concentrating on second portion 40a by supporting second portion 40a with fourth portion 40b and sixth portion 40c. This improves the yield of mounting.

Figure 6:
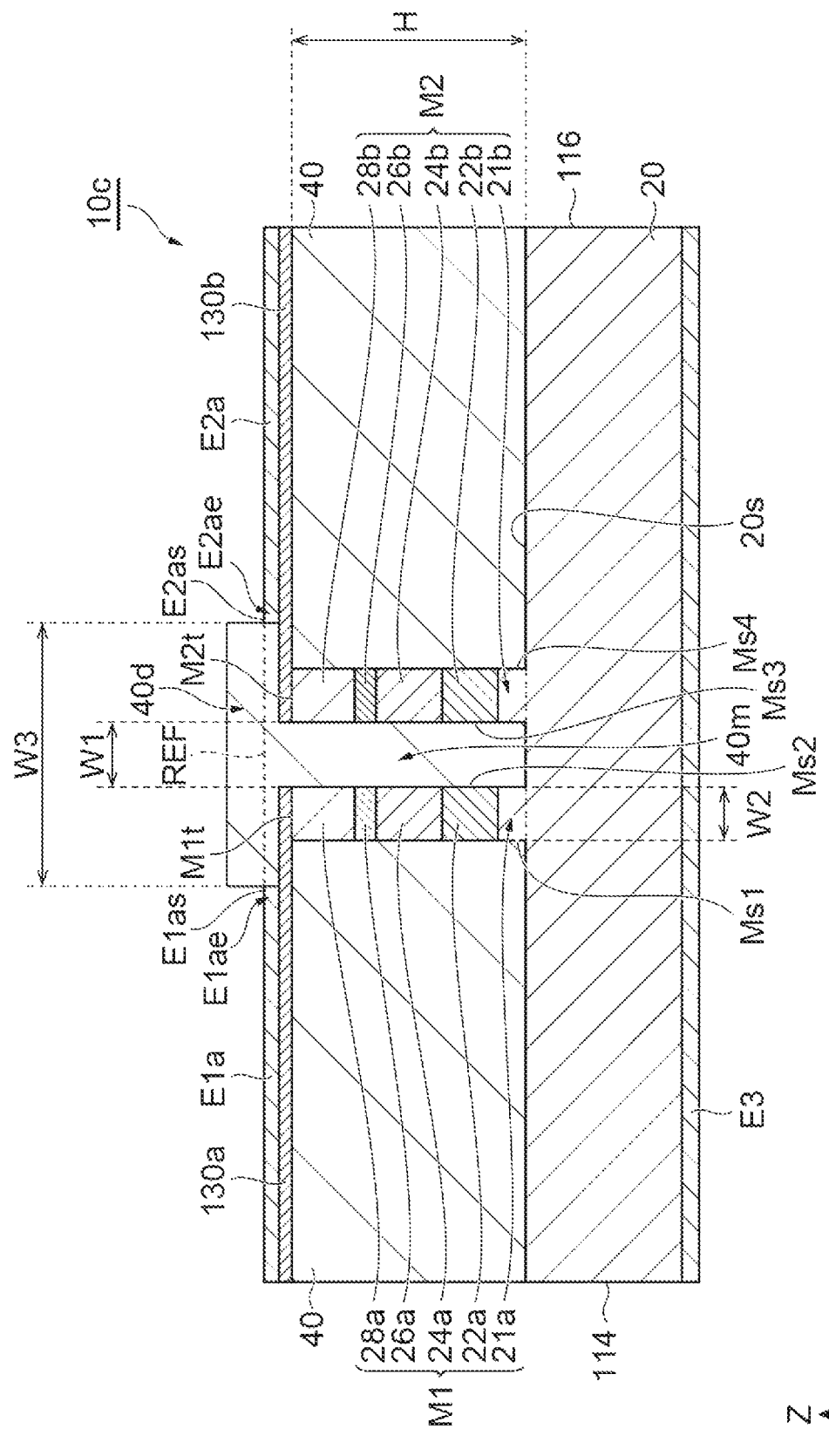
FIG. 6 is a schematic sectional view of a quantum cascade laser according to still another embodiment.

FIG. 6 is a sectional view schematically showing a quantum cascade laser according to still another embodiment. A quantum cascade laser 10c shown in FIG. 6 has the same configuration as that of quantum cascade laser 10 shown in FIG. 2 except that quantum cascade laser 10c includes contact layers 130a and 130b instead of contact layers 30a and 30b, a first electrode E1a and a second electrode E2a instead of first electrode E1 and second electrode E2, and current blocking region 40 of different shape. In the present embodiment, first mesa waveguide M1 and second mesa waveguide M2 do not include contact layers 30a and 30b. Contact layers 130a and 130b have the same configuration as that of contact layers 30a and 30b except that they are different in shape. First electrode E1a and second electrode E2a have the same configuration as that of first electrode E1 and second electrode E2 except that they are different in shape.

Contact layer 130a (first contact layer) is provided on top face M1t of first mesa waveguide M1 and current blocking region 40. First electrode E1a is provided on contact layer 130a. Thus, contact layer 130a is electrically connected to top face M1t of first mesa waveguide M1 and first electrode E1a. Contact layer 130a extends outwardly in the Y-axis direction to a position opposite to second side surface Ms2 with respect to first side surface Ms1. Contact layer 130a extends from second side surface Ms2 to side surface 114 of quantum cascade laser 10c in the Y-axis direction.

Contact layer 130b (second contact layer) is provided on top face M2t of second mesa waveguide M2 and current blocking region 40. Second electrode E2a is provided on contact layer 130b. Thus, contact layer 130b is electrically connected to top face M2t of second mesa waveguide M2 and second electrode E2a. Contact layer 130b extends outwardly in the Y-axis direction to a position opposite to third side surface Ms3 with respect to fourth side surface Ms4. Contact layer 130b extends from third side surface Ms3 to side surface 116 of quantum cascade laser 10c in the Y-axis direction.

First electrode E1a extends from a position outside first side surface Ms1 to side surface 114 of quantum cascade laser 10c in the Y-axis direction. First electrode E1a has an end E1ae close to second electrode E2a in the Y-axis direction. Reference plane REF includes a surface E1as of end E1ae of first electrode E1a.

Second electrode E2a extends from a position outside fourth side surface Ms4 to side surface 116 of quantum cascade laser 10c in the Y-axis direction. Second electrode E2a has an end E2ae close to first electrode E1a in the Y-axis direction. End E2ae faces end E1ae in the Y-axis direction. Reference plane REF may include a surface E2as of end E2ae of second electrode E2a.

Current blocking region 40 in this embodiment has the same configuration as that of current blocking region 40 in FIG. 2 except that current blocking region 40 has a second portion 40d instead of second portion 40a. Second portion 40d extends from second side surface Ms2 toward first side surface Ms1 and from third side surface Ms3 toward fourth side surface Ms4 in the Y-axis direction. Second portion 40d reaches end E1ae of first electrode E1a on contact layer 130a and reaches end E2ae of second electrode E2a on contact layer 130b. Width W3 of second portion 40d is as same as the distance between first electrode E1a and second electrode E2a. Width W3 is greater than a distance between first side surface Ms1 and fourth side surface Ms4.

Quantum cascade laser 10c of the present embodiment can yield the same effects as those of quantum cascade laser 10. In addition, distance between first electrode E1a and second electrode E2a (width W3 of second portion 40d) can be increased. For example, by increasing the length of contact layers 130a and 130b in the Y-axis direction, distance between first electrode E1a and second electrode E2a (width W3 of second portion 40d) can be increased. By increasing width W3 of second portion 40d, dielectric strength between first electrode E1a and second electrode E2a can also be improved.

Figure 7:
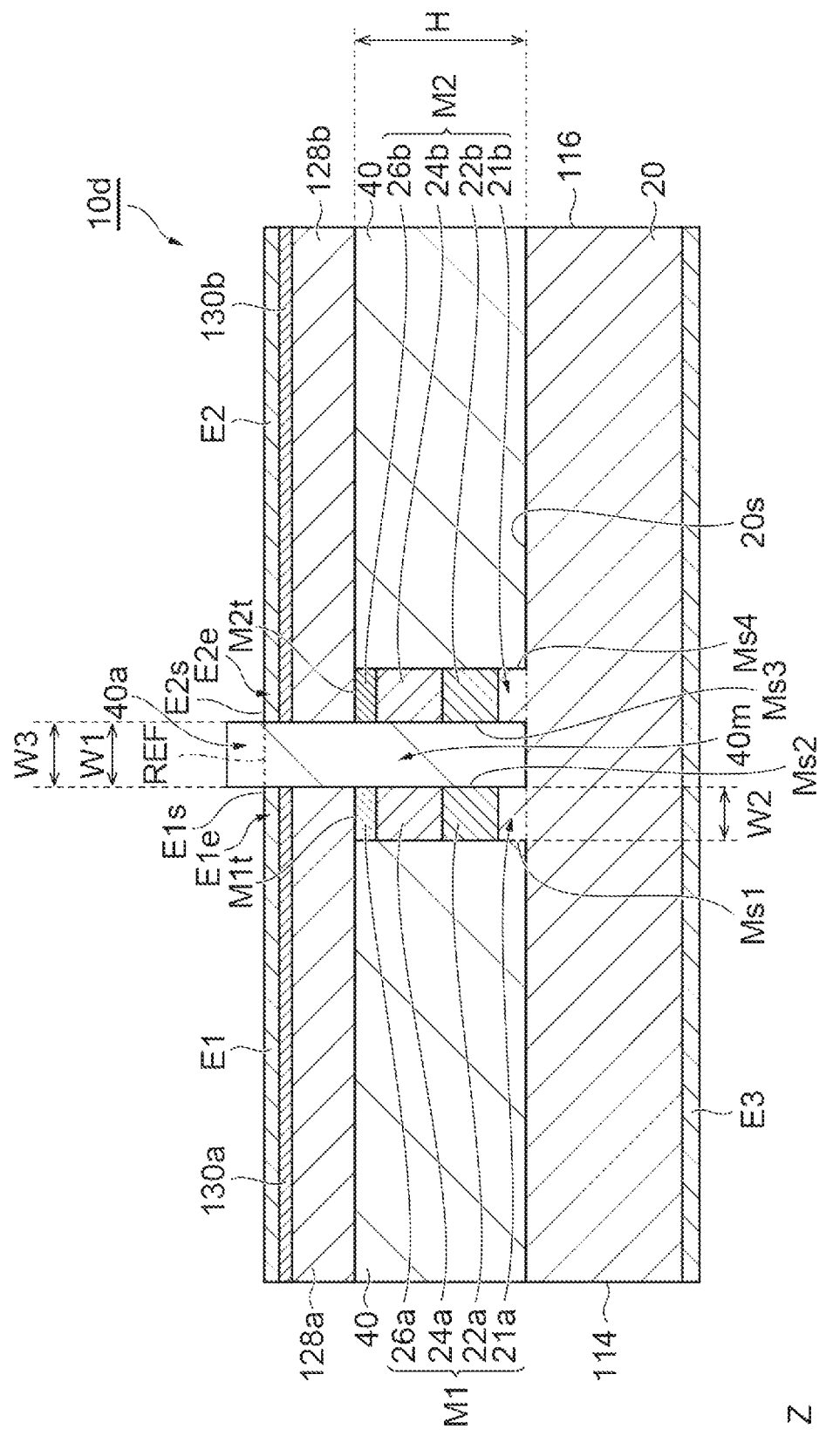
FIG. 7 is a schematic sectional view of a quantum cascade laser according to still another embodiment.

FIG. 7 is a sectional view showing quantum cascade laser according to still another embodiment. A quantum cascade laser 10d shown in FIG. 7 has the same configuration as that of quantum cascade laser 10 in FIG. 2 except that quantum cascade laser 10d includes contact layers 130a and 130b instead of contact layers 30a and 30b, and includes upper cladding layers 128a and 128b instead of upper cladding layers 28a and 28b. In the present embodiment, first mesa waveguide M1 and second mesa waveguide M2 do not include contact layers 30a and 30b, and upper cladding layers 28a and 28b. Upper cladding layers 128a and 128b have the same configuration as that of upper cladding layers 28a and 28b except for the shape.

Upper cladding layer 128a (first cladding layer) is provided on top face M1t of first mesa waveguide M1 and current blocking region 40. Contact layer 130a is provided on upper cladding layer 128a. This means that upper cladding layer 128a is disposed between top face M1t of first mesa waveguide M1 and contact layer 130a. Upper cladding layer 128a extends outwardly in the Y-axis direction to a position opposite to second side surface Ms2 with respect to first side surface Ms1. Upper cladding layer 128a extends from second side surface Ms2 to side surface 114 of quantum cascade laser 10d in the Y-axis direction. The length of upper cladding layer 128a may be different from that of contact layer 130a in the Y-axis direction.

Upper cladding layer 128b (second cladding layer) is provided on top face M2t of second mesa waveguide M2 and current blocking region 40. Contact layer 130b is provided on upper cladding layer 128b. This means that upper cladding layer 128b is disposed between top face M2t of second mesa waveguide M2 and contact layer 130b. Upper cladding layer 128b extends outwardly in the Y-axis direction to a position opposite to third side surface Ms3 with respect to fourth side surface Ms4. Upper cladding layer 128b extends from third side surface Ms3 to side surface 116 of quantum cascade laser 10d in the Y-axis direction. The length of upper cladding layer 128b may be different from that of contact layer 130b in the Y-axis direction.

Quantum cascade laser 10d in the present embodiment can yield the same effects as those of quantum cascade laser 10. In quantum cascade laser 10d, current is injected from first electrode E1 into core layer 24a through contact layer 130a and upper cladding layer 128a. If contact layer 130a and upper cladding layer 128a extend to a position outside first side surface Ms1, electric resistance of the current path that runs from first electrode E1 into first mesa waveguide M1 through contact layer 130a and upper cladding layer 128b is reduced. Similarly, current is injected from second electrode E2 into core layer 24b through contact layer 130b and upper cladding layer 128b. When contact layer 130b and upper cladding layer 128b extend to a position outside fourth side surface Ms4, electric resistance of the current path that runs from second electrode E2 into second mesa waveguide M2 through contact layer 130b and upper cladding layer 128b is reduced. A power consumption of quantum cascade laser 10d can thus be reduced.

Figure 8:
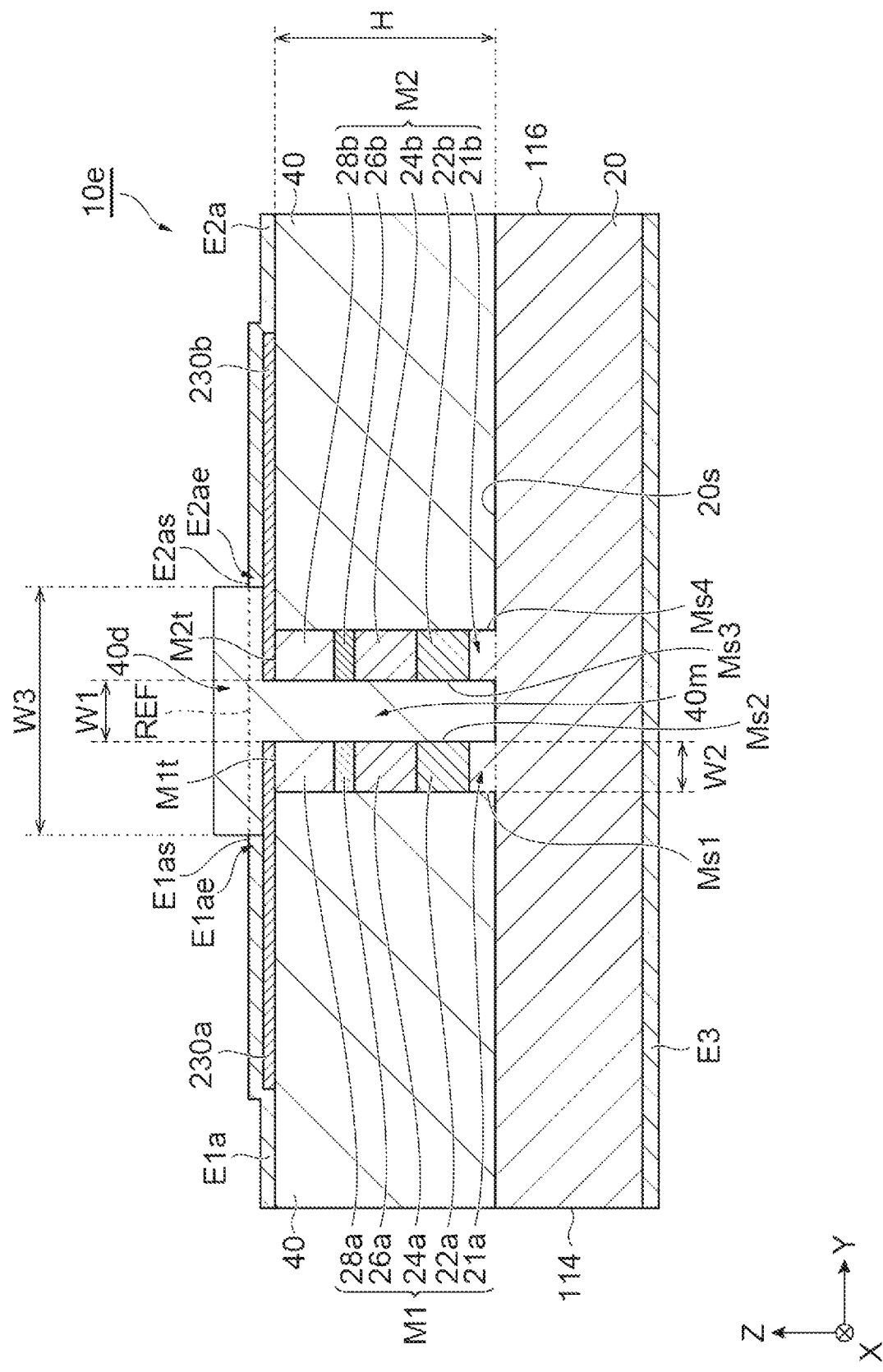
FIG. 8 is a schematic sectional view of a quantum cascade laser according to still another embodiment.

FIG. 8 is a sectional view schematically showing a quantum cascade laser according to still another embodiment. A quantum cascade laser 10e shown in FIG. 8 has the same configuration as that of quantum cascade laser 10c shown in FIG. 6 except that contact layers 230a and 230b are provided instead of contact layers 130a and 130b. Contact layers 230a and 230b have the same configuration as that of contact layers 130a and 130b except that they are different in shape.

Contact layer 230a has the same configuration as that of contact layer 130a except that contact layer 230a extends in the Y-axis direction from second side surface Ms2 to a position between side surface 114 of quantum cascade laser 10e and first side surface Ms1. First electrode E1a contacts current blocking region 40 in the area ranging from the position between side surface 114 of quantum cascade laser 10e and first side surface Ms1 to side surface 114.

Contact layer 230b has the same configuration as that of contact layer 130b except that contact layer 230b extends in the Y-axis direction from third side surface Ms3 to a position between side surface 116 of quantum cascade laser 10e and fourth side surface Ms4. Second electrode E2a contacts current blocking region 40 in an area ranging from the position between side surface 116 of quantum cascade laser 10e and fourth side surface Ms4 to side surface 116.

Second portion 40d of current blocking region 40 extends from second side surface Ms2 toward first side surface Ms1 and from third side surface Ms3 toward fourth side surface Ms4 in the Y-axis direction. Second portion 40d reaches end E1ae of first electrode E1a on contact layer 230a and end E2ae of second electrode E2a on contact layer 230b. Width W3 of second portion 40d in the Y-axis direction is as same as the distance between first electrode E1a and second electrode E2a. Width W3 is greater than a distance between first side surface Ms1 and fourth side surface Ms4.

Quantum cascade laser 10e of the present embodiment can yield the same effects as those of quantum cascade laser 10c. In addition, when performed with cleavage, side surfaces 114 and 116 of quantum cascade laser 10e can be formed without cutting contact layers 230a and 230b. Therefore, damage to contact layers 230a and 230b due to cleavage can be reduced.

Figure 9:
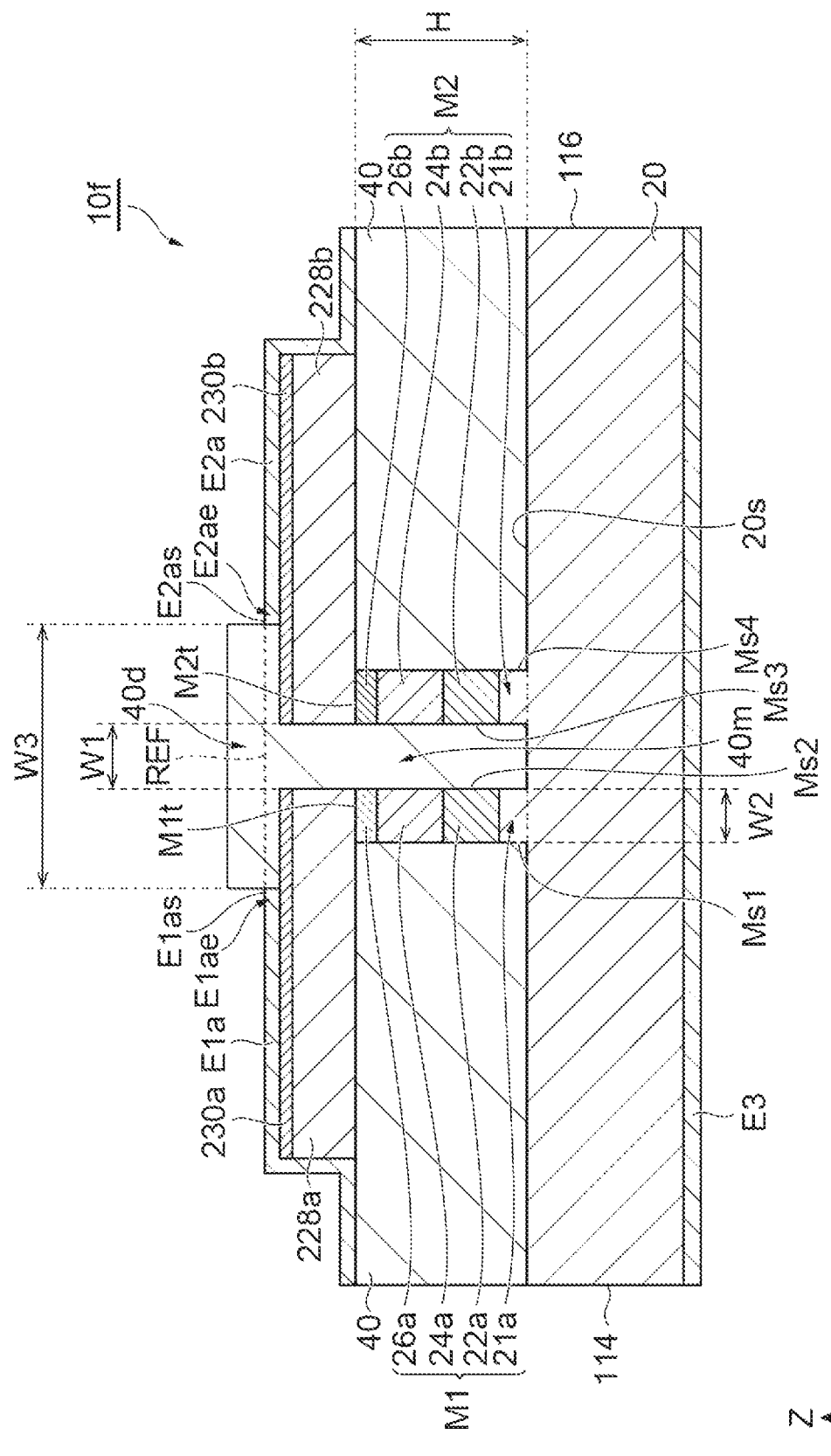
FIG. 9 is a schematic sectional view of a quantum cascade laser according to still another embodiment.

FIG. 9 is a sectional view schematically showing a quantum cascade laser according to still another embodiment. A quantum cascade laser 10f shown in FIG. 9 has the same configuration as that of quantum cascade laser 10e shown in FIG. 8 except that upper cladding layers 228a and 228b are provided instead of upper cladding layers 28a and 28b. In the present embodiment, first mesa waveguide M1 and second mesa waveguide M2 do not include upper cladding layers 28a and 28b. Upper cladding layers 228a and 228b have the same configuration as that of upper cladding layers 28a and 28b except that they are different in shape.

Upper cladding layer 228a (first cladding layer) is provided on top face M1t of first mesa waveguide M1 and current blocking region 40. Contact layer 230a is provided on upper cladding layer 228a.

This means that upper cladding layer 228a is disposed between top face M1t of first mesa waveguide M1 and contact layer 230a. Upper cladding layer 228a extends outward in the Y-axis direction to a position opposite to second side surface Ms2 with respect to first side surface Ms1. Upper cladding layer 228a extends in the Y-axis direction from second side surface Ms2 to a position between side surface 114 of quantum cascade laser 10f and first side surface Ms1.

Upper cladding layer 228b (second cladding layer) is provided on top face M2t of second mesa waveguide M2 and current blocking region 40. Contact layer 230b is provided on upper cladding layer 228b. This means that upper cladding layer 228b is disposed between top face M2t of second mesa waveguide M2 and contact layer 230b. Upper cladding layer 228b extends outwardly in the Y-axis direction to a position opposite to third side surface Ms3 with respect to fourth side surface Ms4. Upper cladding layer 228b extends in the Y-axis direction from third side surface Ms3 to a position between side surface 116 of quantum cascade laser 10f and fourth side surface Ms4.

Quantum cascade laser 10f of the present embodiment can yield the same effects as those of quantum cascade 10e. In quantum cascade laser 10f, current is injected from first electrode E1a to core layer 24a through contact layer 230a and upper cladding layer 228a. When contact layer 230a and upper cladding layer 228a extend to a position outside first side surface Ms1, the electric resistance of the current path that runs from first electrode E1a to first mesa waveguide M1 is reduced. Similarly, current is injected from second electrode E2a to core layer 24b through contact layer 230b and upper cladding layer 228b. When contact layer 230b and upper cladding layer 228b extend to a position outside fourth side surface Ms4, the electric resistance of the current path that runs from second electrode E2a to second mesa waveguide M2 is reduced. A power consumption of quantum cascade laser 10f can thus be reduced. Furthermore, when performed with cleavage, side surfaces 114 and 116 of quantum cascade laser 10f can be formed without cutting contact layers 230a and 230b and upper cladding layers 228a and 228b. Therefore, damage to contact layers 230a and 230b and upper cladding layers 228a and 228b due to cleavage can be reduced.

Hereinafter, examples of manufacturing method of quantum cascade laser 10 in FIG. 2 will be described referring to FIG. 10A, FIG. 10B, FIG. 10C, FIG. 11A, FIG. 11B and FIG. 11C. FIG. 10A to FIG. 11C each show the respective step of manufacturing method of quantum cascade laser 10 shown in FIG. 2.

Figure 10A:
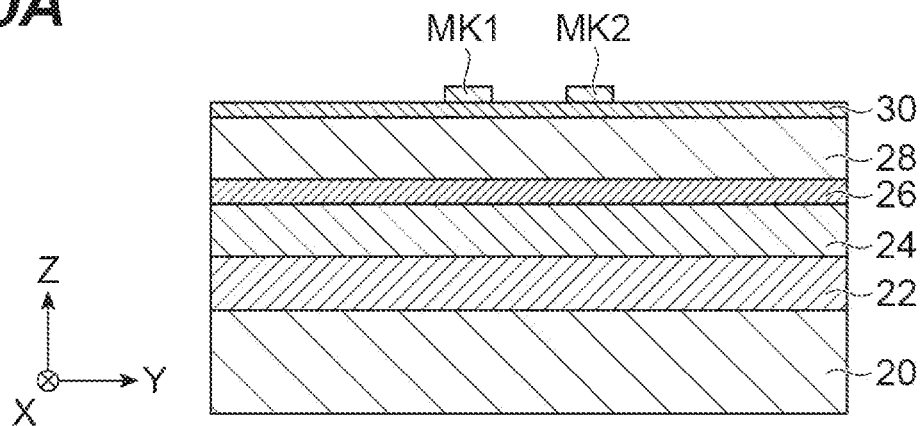
FIG. 10A shows a step of a method for producing a quantum cascade laser in FIG. 2.

As shown in FIG. 10A, a semiconductor layer 22 for lower cladding layers 22a and 22b, a semiconductor layer 24 for core layers 24a and 24b, a semiconductor layer 26 for grating layers 26a and 26b, a semiconductor layer 28 for upper cladding layers 28a and 28b, and a semiconductor layer 30 for contact layers 30a and 30b are sequentially formed on substrate 20. Each semiconductor layer can be grown, for example, by molecular beam epitaxy or organometallic vapor phase epitaxy (OMVPE) methods. Semiconductor layer 26 has a plurality of grooves periodically arranged with pitch Λ (refer to FIG. 3). The grooves can be formed by, for example, photolithography and etching. After forming grooves in semiconductor layer 26, semiconductor layer 28 is grown to fill the grooves of semiconductor layer 26.

Subsequently, a mask MK1 for first mesa waveguide M1 and a mask MK2 for second mesa waveguide M2 are formed on semiconductor layer 30. Masks MK1 and MK2 may be formed by, for example, photolithography and etching. Masks MK1 and MK2 include, for example, insulating materials. Examples of insulating materials include SiN, SiON, $SiO_2$, alumina, and the like. The dry etching depth is, for example, 10 μm or more.

Figure 10B:
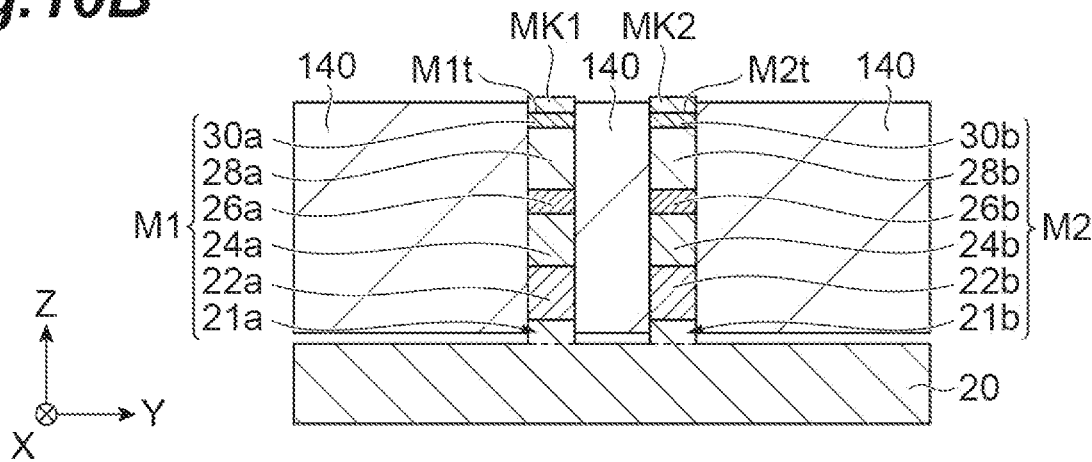
FIG. 10B shows a step of the method for producing a quantum cascade laser in FIG. 2.

Next, as shown in FIG. 10B, first mesa waveguide M1 and second mesa waveguide M2 are formed by etching semiconductor layers 30, 28, 26, 24, and 22, and a part of substrate 20 using masks MK1 and MK2. Examples of etching include dry etching or wet etching. Examples of dry etching include reactive ion etching with an etching gas.

Subsequently, a current blocking region 140 is grown to bury first mesa waveguide M1 and second mesa waveguide M2 using masks MK1 and MK2. When the depth of the gap to be buried between first mesa waveguide M1 and second mesa waveguide M2 is 10 μm or more, current blocking region 140 can be favorably formed using, for example, OMVPE method by setting distance W1 between the two waveguides to be 2 μm or more.

Figure 10C:
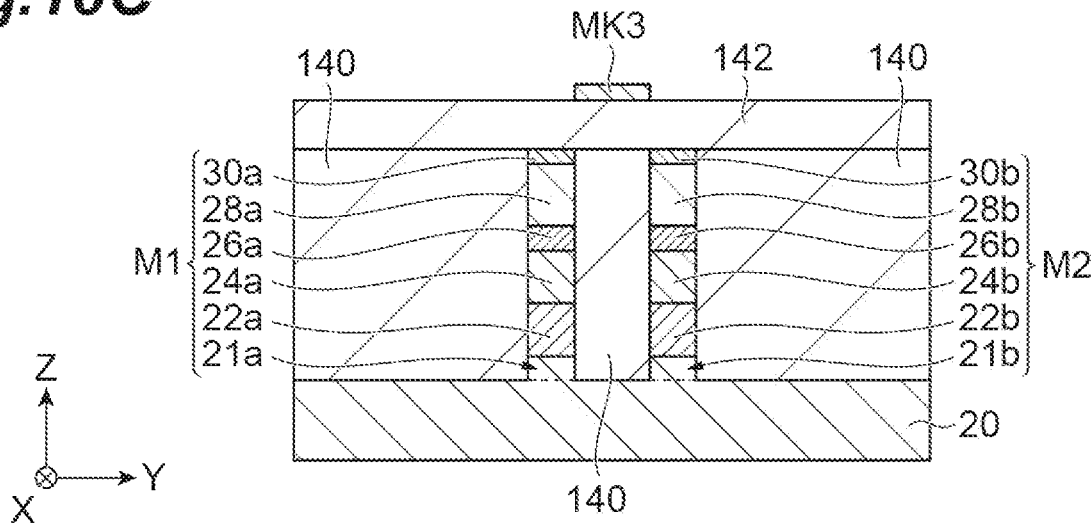
FIG. 10C shows a step of the method for producing a quantum cascade laser in FIG. 2.

As shown in FIG. 10C, after removing masks MK1 and MK2, a current blocking region 142 is formed on first mesa waveguide M1, second mesa waveguide M2, and current blocking region 140. Subsequently, a mask MK3 for second portion 40a of current blocking region 40 is formed on current blocking region 142. Mask MK3 is positioned between first mesa waveguide M1 and second mesa waveguide M2 in the Y-axis direction.

Figure 11A:
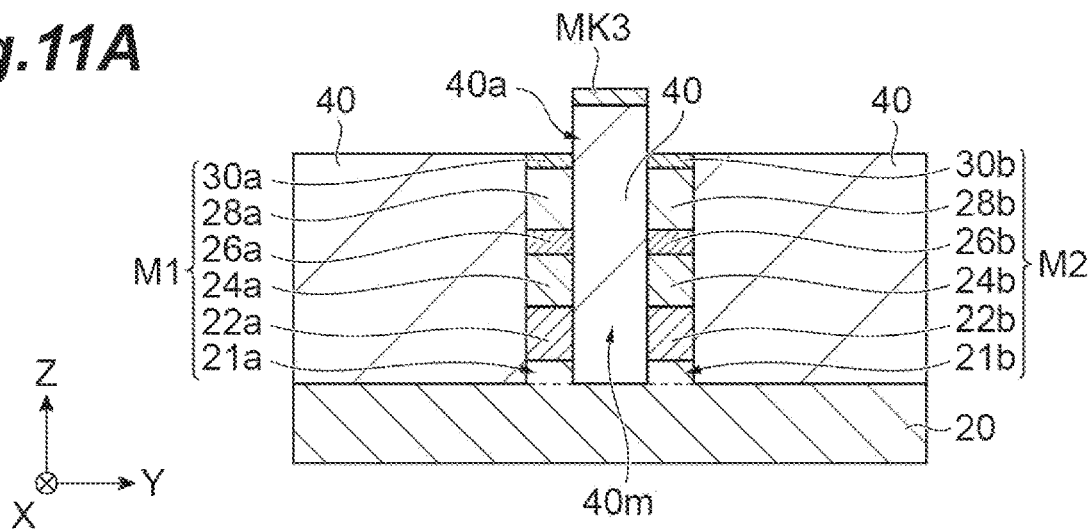
FIG. 11A shows a step of the method for producing a quantum cascade laser in FIG. 2.

Next, as shown in FIG. 11A, current blocking region 142 is etched using mask MK3 to form second portion 40a from current blocking region 142. As a result, a current blocking region 40 having first portion 40m and second portion 40a is formed.

Figure 11B:
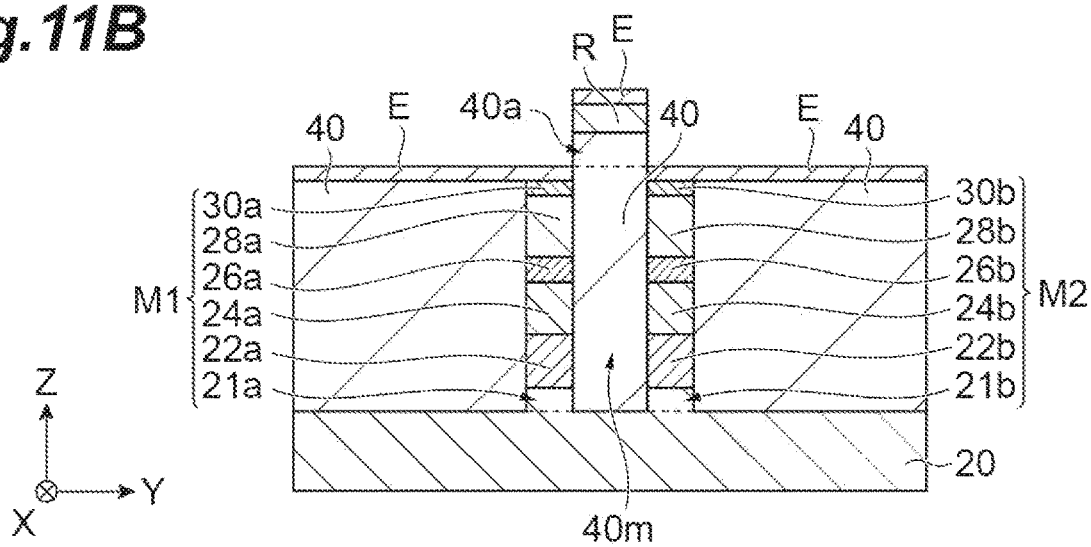
FIG. 11B shows a step of the method for producing a quantum cascade laser in FIG. 2.

As shown in FIG. 11B, after removing mask MK3, a resist pattern R is formed on second portion 40a.

Subsequently, a metal film E for first electrode E1 and second electrode E2 is formed on first mesa waveguide M1, second mesa waveguide M2, current blocking region 40, and resist pattern R. Metal film E may be formed, for example, by vapor deposition, sputtering, or the like.

Figure 11C:
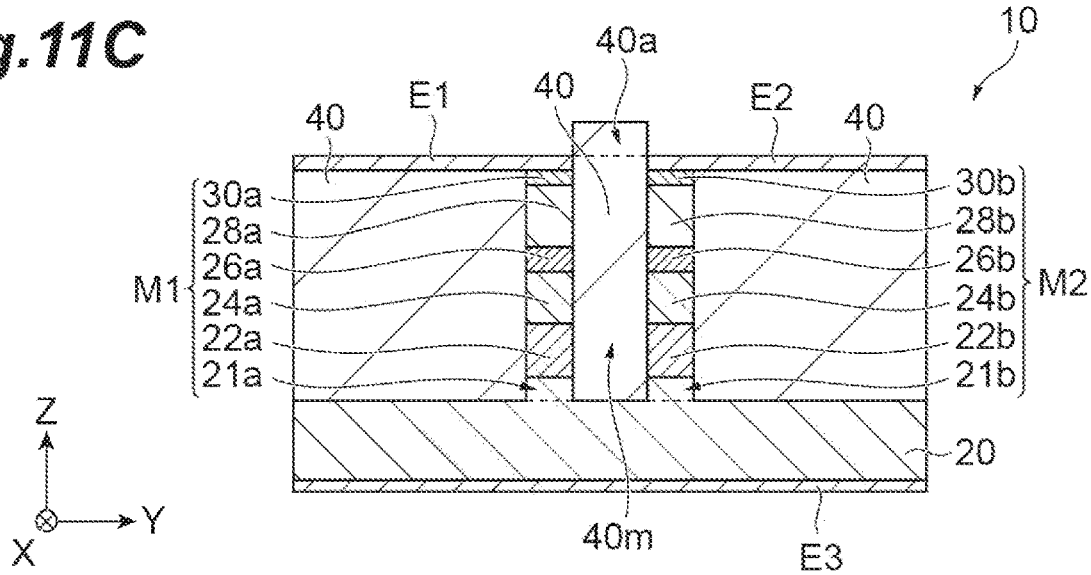
FIG. 11C shows a step of the method for producing a quantum cascade laser in FIG. 2.

As shown in FIG. 11C, first electrode E1 and second electrode E2 are formed by removing resist pattern R and metal film E on resist pattern R by the lift-off method.

Subsequently, substrate 20 is thinned down to a thickness of, for example, 100 μm to 200 μm by polishing or the like. Third electrode E3 is formed on the back surface of substrate 20 thereafter. Quantum cascade laser 10 shown in FIG. 2 can be obtained by cleaving substrate 20.

Quantum cascade lasers 10a, 10b, 10c, 10d, 10e, and 10f can be manufactured in the same manner. For example, quantum cascade laser 10a shown in FIG. 4 can be manufactured by forming insulating layer 50 after forming first electrode E1 and second electrode E2 by, for example, photolithography and etching.

Quantum cascade laser 10b shown in FIG. 5 can be manufactured by also forming mask MK3 in a region outwardly away from first side surface Ms1 of first mesa waveguide M1 in the Y-axis direction and in a region outwardly away from fourth side surface Ms4 of second mesa waveguide M2 in the Y-axis direction. Current blocking region 142 is etched using mask MK3 to form second portion 40a, fourth portion 40b, and sixth portion 40c from current blocking region 142.

Quantum cascade laser 10c shown in FIG. 6 can be manufactured by forming first mesa waveguide M1 and second mesa waveguide M2 using masks MK1 and MK2 without forming semiconductor layer 30 prior to forming masks MK1 and MK2. After current blocking region 140 are grown to bury first mesa waveguide M1 and second mesa waveguide M2, masks MK1 and MK2 are removed to form semiconductor layer 30. Then, contact layers 130a and 130b are formed from semiconductor layer 30 by, for example, photolithography and etching. Further, current blocking region 142 is formed on contact layers 130a and 130b. Current blocking region 142 is also formed on current blocking region 140 between first mesa waveguide M1 and second mesa waveguide M2. Subsequently, current blocking region 142 is etched using mask MK3 with width W3 to form second portion 40d from current blocking region 142.

Quantum cascade laser 10d shown in FIG. 7 can be manufactured by forming first mesa waveguide M1 and second mesa waveguide M2 using masks MK1 and MK2 without forming semiconductor layers 28 and 30 prior to forming masks MK1 and MK2. After growing current blocking region 140 to bury first mesa waveguide M1 and second mesa waveguide M2, masks MK1 and MK2 are removed to form semiconductor layers 28 and 30. Subsequently, by photolithography, etching or the like, semiconductor layers 28 and 30 disposed on current blocking region 140 between first mesa waveguide M1 and second mesa waveguide M2 are removed to form a gap, thereby forming upper cladding layers 128a and 128b and contact layers 130a and 130b. After that, current blocking region 140 is further grown to bury the gap. Then current blocking region 142 is formed, and second portion 40a is formed from current blocking region 142 using mask MK3.

Quantum cascade laser 10e shown in FIG. 8 can be manufactured by forming first mesa waveguide M1 and second mesa waveguide M2 using masks MK1 and MK2 without forming semiconductor layer 30 prior to forming masks MK1 and MK2. After growing current blocking region 140 to bury first mesa waveguide M1 and second mesa waveguide M2, masks MK1 and MK2 are removed to form semiconductor layer 30. After removing semiconductor layer 30 disposed on current blocking region 140 between first mesa waveguide M1 and second mesa waveguide M2 by photolithography, etching, or the like to form a gap, current blocking region 142 is formed on the entire surface of the device. Current blocking region 142 is also grown in the gap between first mesa waveguide M1 and second mesa waveguide M2. Subsequently, current blocking region 142 is etched using mask MK3 with width W3 to form second portion 40d from current blocking region 142. Then, using a mask with an opening extending in the X-axis direction, semiconductor layer 30 located in the opening are etched only in a region from a position between first side surface Ms1 and side surface 114 to side surface 114 in the Y-axis direction, and in a region from a position between fourth side surface Ms4 and side surface 116 to side surface 116 in the Y-axis direction, thereby forming contact layers 230a and 230b.

Quantum cascade laser 10f shown in FIG. 9 can be manufactured by forming first mesa waveguide M1 and second mesa waveguide M2 using masks MK1 and MK2 without forming semiconductor layers 28 and 30 prior to forming masks MK1 and MK2. After growing current blocking region 140 to bury first mesa waveguide M1 and second mesa waveguide M2, masks MK1 and MK2 are removed to form semiconductor layers 28 and 30. After removing semiconductor layers 28 and 30 disposed on current blocking region 140 between first mesa waveguide M1 and second mesa waveguide M2 by photolithography, etching, or the like to form a gap, current blocking region 140 is further grown to bury the gap. Further, current blocking region 142 is formed on the entire surface of the device. Subsequently, current blocking region 142 is etched using mask MK3 with width W3 to form second portion 40d from current blocking region 142. Then, using a mask with an opening extending in the X-axis direction, semiconductor layers 28 and 30 located in the opening are etched only in a region from a position between first side surface Ms1 and side surface 114 to side surface 114 in the Y-axis direction, and in a region from a position between fourth side surface Ms4 and side surface 116 to side surface 116 in the Y-axis direction, thereby forming upper cladding layers 228a and 228b and contact layers 230a and 230b.

Whereas the principles of the present disclosure have been illustrated and described with reference to preferred embodiments, the present disclosure is not limited to any particular configuration disclosed in the embodiments.

The components of each embodiment may be combined with each other. For example, quantum cascade lasers 10b, 10c, 10d, 10e and 10f may each include insulating layer 50.

Quantum cascade lasers 10, 10a, 10b, 10c, 10d, 10e, and 10f may not include grating layers 26a and 26b. In this case, each of quantum cascade laser operates as a Fabry-Perot laser rather than a distributed feedback laser.

What is claimed is:

1. A quantum cascade laser comprising:
a first mesa waveguide disposed on a substrate, the first mesa waveguide including a first core layer;
a second mesa waveguide disposed on the substrate, the second mesa waveguide including a second core layer;
a first electrode electrically connected to the first mesa waveguide;
a second electrode electrically connected to the second mesa waveguide; and
a current blocking region disposed on the substrate, the current blocking region burying the first and second mesa waveguides,
wherein
the first and second mesa waveguides extend in a first direction,
the first and second mesa waveguides are arranged apart from each other by a distance in a second direction intersecting with the first direction,
the current blocking region has a first portion and a second portion,
the first portion is disposed between the first mesa waveguide and the second mesa waveguide,
the second portion is disposed on the first portion,
each of the first electrode and the second electrode has an end,
the end of the first electrode and the end of the second electrode are facing each other in the second direction, and
the second portion protrudes from a reference plane including a surface of the end of the first electrode and extending in the first and second directions.

2. The quantum cascade laser according to claim 1 further comprising an insulating layer covering the second portion.

3. The quantum cascade laser according to claim 1, wherein
the current blocking region has a third portion, a fourth portion disposed on the third portion, a fifth portion, and a sixth portion disposed on the fifth portion,
the first mesa waveguide is disposed between the first portion and the third portion,
the second mesa waveguide is disposed between the first portion and the fifth portion, and
the fourth portion and the sixth portion protrude from the reference plane.

4. The quantum cascade laser according to claim 1, wherein
the first mesa waveguide has a first side surface and a second side surface,
the second mesa waveguide has a third side surface and a fourth side surface,
the first to fourth side surfaces extend in the first direction,
the second side surface faces the third side surface, and
the second portion extends in the second direction from the second side surface toward the first side surface and from the third side surface toward the fourth side surface.

5. The quantum cascade laser according to claim 1 further comprising:
a first contact layer electrically connected to the first electrode and a top of the first mesa waveguide; and
a second contact layer electrically connected to the second electrode and a top of the second mesa waveguide,
wherein
the first mesa waveguide has a first side surface and a second side surface,
the second mesa waveguide has a third side surface and a fourth side surface,
the first to fourth side surfaces extend in the first direction,
the second side surface faces the third side surface,
the first contact layer extends to a position opposite to the second side surface with respect to the first side surface in the second direction, and
the second contact layer extends to a position opposite to the third side surface with respect to the fourth side surface in the second direction.

6. The quantum cascade laser according to claim 5 further comprising:
a first cladding layer disposed between the first contact layer and the top of the first mesa waveguide; and
a second cladding layer disposed between the second contact layer and the top of the second mesa waveguide,
wherein
the first cladding layer extends to a position opposite to the second side surface with respect to the first side surface in the second direction, and
the second cladding layer extends to a position opposite to the third side surface with respect to the fourth side surface in the second direction.

7. The quantum cascade laser according to claim 6, wherein
the quantum cascade laser comprises fifth and sixth side surfaces extending in the first direction,
the first cladding layer extends from the second side surface to a position between the fifth side surface and the first side surface in the second direction, and the second cladding layer extends from the third side surface to a position between the sixth side surface and the fourth side surface in the second direction.

8. The quantum cascade laser according to claim 5, wherein the quantum cascade laser comprises fifth and sixth side surfaces extending in the first direction, the first contact layer extends from the second side surface to a position between the fifth side surface and the first side surface in the second direction, and the second contact layer extends from the third side surface to a position between the sixth side surface and the fourth side surface in the second direction.

9. The quantum cascade laser according to claim 1, wherein the distance is 30 μm or less.

* * * * *